(12) United States Patent
Yoshida

(10) Patent No.: US 7,733,059 B2
(45) Date of Patent: Jun. 8, 2010

(54) ABNORMALITY DIAGNOSTIC DEVICE

(75) Inventor: Shinsuke Yoshida, Hadano (JP)

(73) Assignee: Nissan Motor Co., Ltd., Yokohama (JP)

( * ) Notice: Subject to any disclaimer, the term of this patent is extended or adjusted under 35 U.S.C. 154(b) by 302 days.

(21) Appl. No.: 11/957,687

(22) Filed: Dec. 17, 2007

(65) Prior Publication Data

US 2008/0143298 A1 Jun. 19, 2008

(30) Foreign Application Priority Data

Dec. 18, 2006 (JP) ............................. 2006-339897
Nov. 2, 2007 (JP) ............................. 2007-285875

(51) Int. Cl.
*H02J 7/00* (2006.01)
(52) U.S. Cl. ..................... 320/118; 320/116; 320/136
(58) Field of Classification Search ................ 320/116, 320/118–120, 122, 134, 136
See application file for complete search history.

(56) References Cited

U.S. PATENT DOCUMENTS

| | | | |
|---|---|---|---|
| 6,169,385 B1 * | 1/2001 | Konishi et al. .............. | 320/118 |
| 6,891,352 B2 * | 5/2005 | Miyazaki et al. ............ | 320/118 |
| 6,960,899 B2 * | 11/2005 | Kobayashi et al. .......... | 320/136 |
| 6,977,483 B2 * | 12/2005 | Iwashima .................... | 320/122 |
| 7,339,352 B2 * | 3/2008 | Iwashima et al. ........... | 320/134 |
| 7,471,065 B2 * | 12/2008 | Emori et al. ................ | 320/116 |
| 7,564,217 B2 * | 7/2009 | Tanigawa et al. ............ | 320/118 |

FOREIGN PATENT DOCUMENTS

| JP | 2001-157367 A | 6/2001 |
|---|---|---|
| JP | 2005-168118 A | 6/2005 |

* cited by examiner

*Primary Examiner*—Edward Tso
*Assistant Examiner*—Ramy Ramadan
(74) *Attorney, Agent, or Firm*—Global IP Counselors, LLP

(57) ABSTRACT

An abnormality diagnostic device is configured to diagnose an abnormality in a battery pack having a plurality of cells connected in series. Each of a plurality of diagnostic voltage detecting circuits is configured to detect one of a voltage across a corresponding one of discharging circuits. An abnormality diagnostic control section is configured to perform a first diagnostic operation in which the switches corresponding to alternate ones of the cells are turned on and a second diagnostic operation in which all of the switches are turned on, and to determine whether a break exists in an electrical connection or an abnormality exists in one of the switches based on the voltages detected by the diagnostic voltage detecting circuits during the first diagnostic operation and the voltages detected by the diagnostic voltage detecting circuits during the second diagnostic operation.

20 Claims, 8 Drawing Sheets

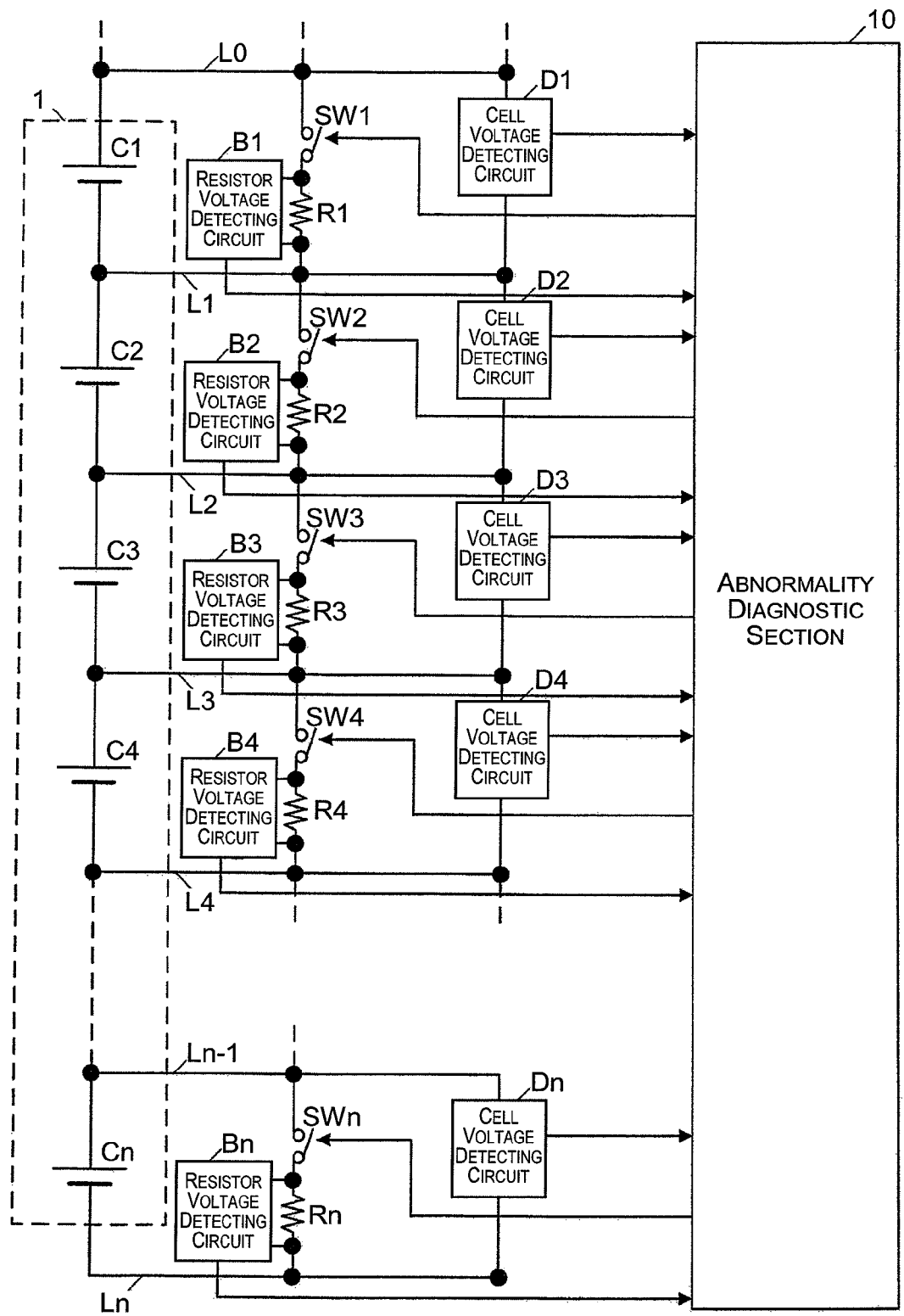
F I G. 1

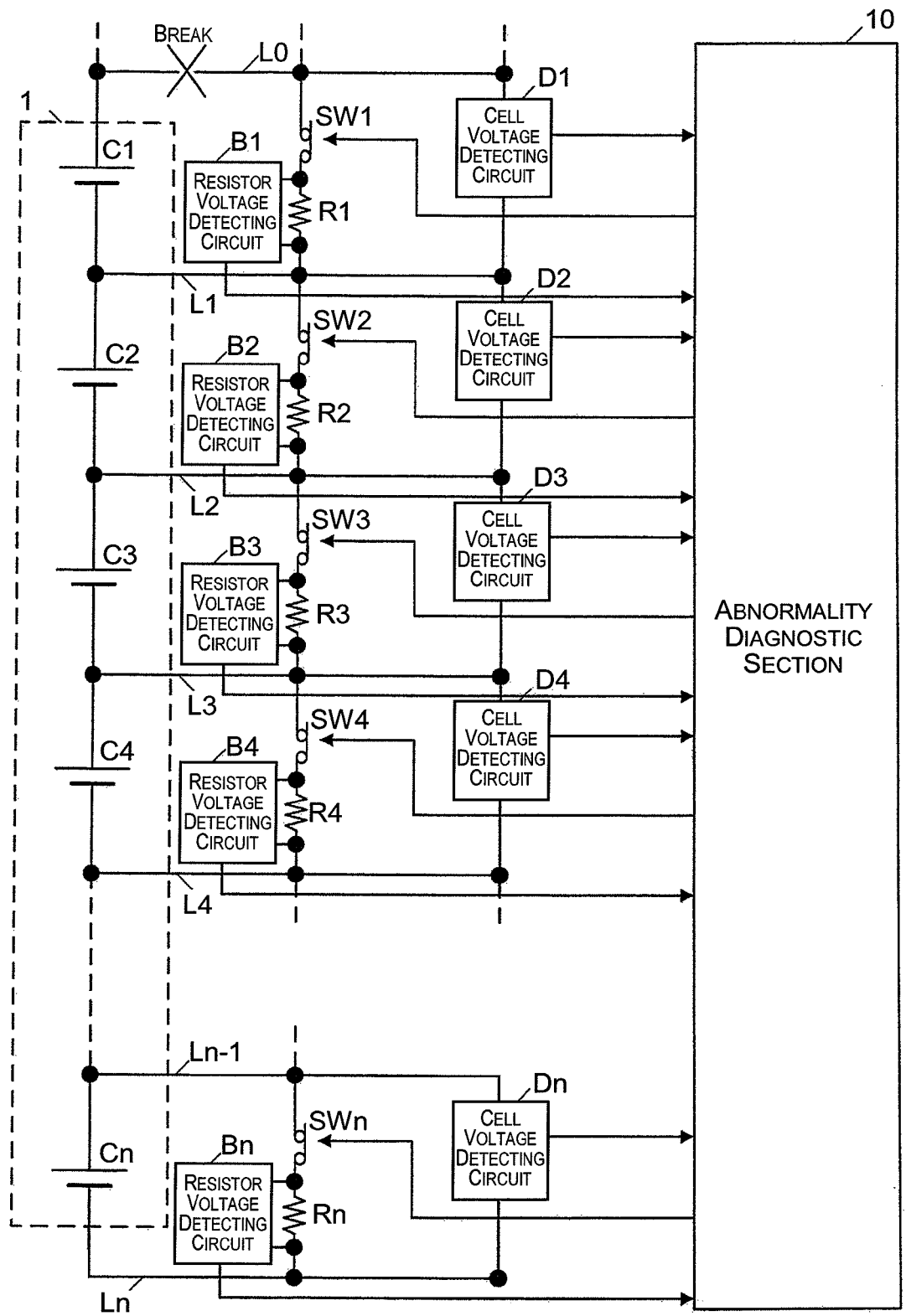
F I G. 3

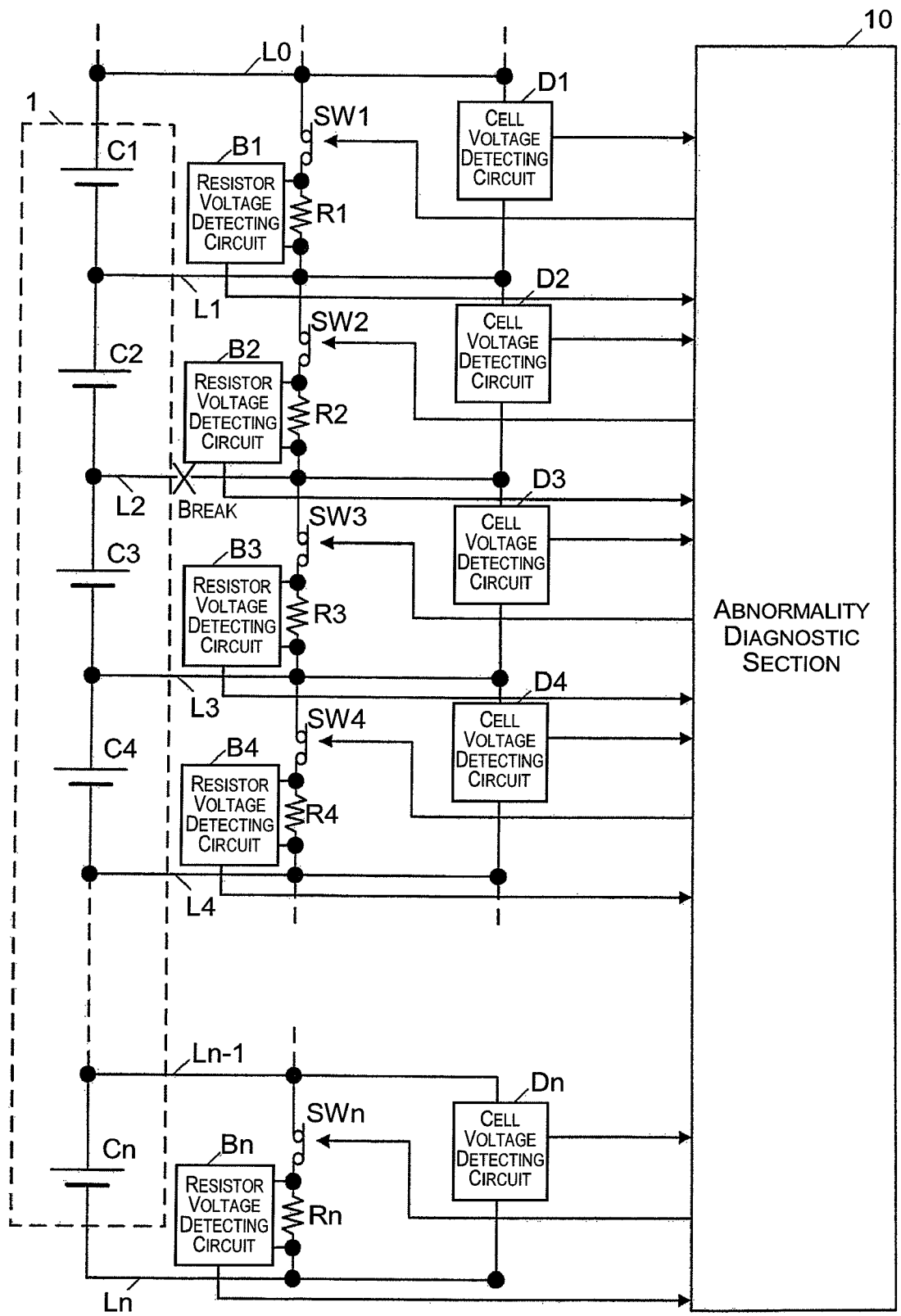
F I G. 4

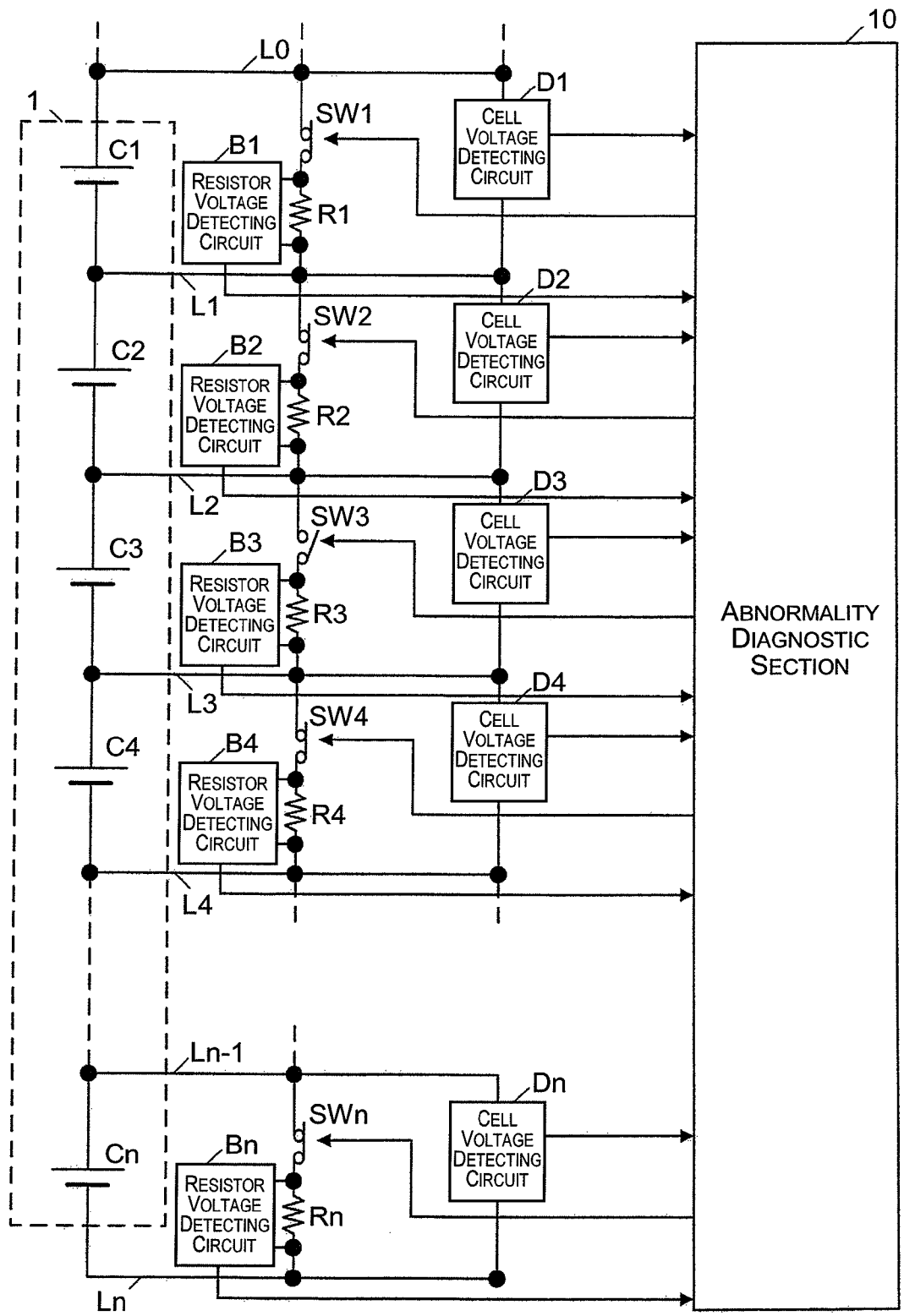
F I G. 5

| | Turn Off All Switches | | | Turn On Odd Numbered Switches | | | Turn On All Switches | | |
|---|---|---|---|---|---|---|---|---|---|
| | Resistor Voltage Diagnosis | Overcharge Diagnosis | Overdischarge Diagnosis | Resistor Voltage Diagnosis | Overcharge Diagnosis | Overdischarge Diagnosis | Resistor Voltage Diagnosis | Overcharge Diagnosis | Overdischarge Diagnosis |
| Switching Abnormality | Abnormal (Off) | Normal | Normal | Abnormal | Normal | Normal | Abnormal (On) | Normal | Normal |
| Break in Line L1 – Ln | Normal | Normal | Normal | Abnormal | Abnormal | Abnormal | Normal | Normal | Normal |
| Break in Line L0 | Normal | Normal | Abnormal | Abnormal | Normal | Abnormal | Abnormal (On) | Normal | Abnormal |
| Overcharge | Normal | Abnormal | Normal | Normal | Abnormal | Normal | Normal | Abnormal | Normal |
| Overdischarge | Normal | Normal | Abnormal | Normal | Normal | Abnormal | Normal | Normal | Abnormal |
| No Line Breakage | Normal | Normal | Normal | Normal | Normal | Normal | Normal | Normal | Normal |

FIG. 6

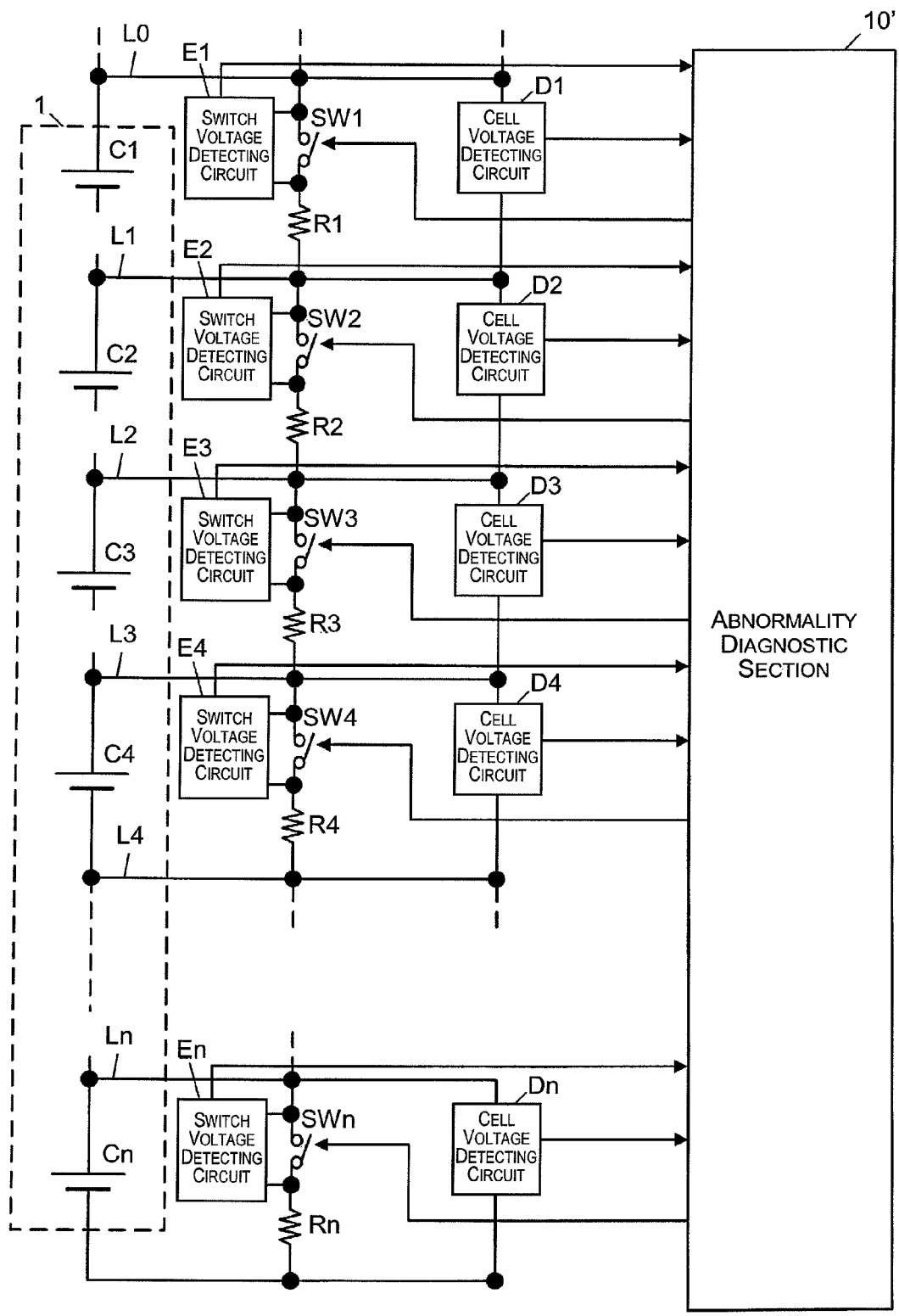
F I G. 7

ABNORMALITY DIAGNOSTIC DEVICE

CROSS-REFERENCE TO RELATED APPLICATIONS

This application claims priority to Japanese Patent Application No. 2006-339897, filed on Dec. 18, 2006 and Japanese Patent Application No. 2007-285875 filed on Nov. 2, 2007. The entire disclosures of Japanese Patent Application No. 2006-339897 and Japanese Patent Application No. 2007-285875 are hereby incorporated herein by reference.

BACKGROUND OF THE INVENTION

1. Field of the Invention

The present invention relates to an abnormality diagnostic device for a battery pack adapted to detect if there is a break in an electrical connection between a cell and a detection terminal provided between terminals of the cell.

2. Background Information

A battery pack generally has a plurality of cells and a plurality of detection terminals for detecting the voltages between the terminals of the cells. Japanese Laid-Open Patent Application Publication No. 2001-157367 discloses a device for determining if there is a break in an electrical connection between a detection terminal and a cell of such a battery pack. The conventional device controls switches to short circuit the detection terminals of the cell for a prescribed amount of time and then to cancel the short circuit. If, after a prescribed amount of time has elapsed, the voltage between the detection terminals remains substantially the same as when the detection terminals were short circuited, then the device determines that there is a break in the electrical connection between the cell and the detection terminals.

Japanese Laid-Open Patent Application Publication No. 2005-168118 discloses another device configured to alternately short-circuit connections between detection terminals of a plurality of cells, which form a battery pack, to determine if a cell is over-discharged or a break in a wire connection exists.

In view of the above, it will be apparent to those skilled in the art from this disclosure that there exists a need for an improved abnormality diagnostic device. This invention addresses this need in the art as well as other needs, which will become apparent to those skilled in the art from this disclosure.

SUMMARY OF THE INVENTION

The devices described in the above mentioned references may determine that there is a break in an electrical connection between the cell and the detection terminals even when no break actually exists in the electrical connection between the cell and the detection terminals, but a switch portion that is used to short-circuit the detection terminals of a cell is malfunctioning.

One object of the present invention is to provide an abnormality diagnostic device that more accurately determines when a break in an electrical connection of a battery has occurred.

Accordingly, an abnormality diagnostic device is provided for diagnosing an abnormality in a battery pack having a plurality of cells connected in series, which includes a plurality of cell voltage detecting circuits, a plurality of discharging circuits, a switch drive circuit, a plurality of diagnostic voltage detecting circuits and an abnormality diagnostic control section. Each of the cell voltage detecting circuits is connected in parallel to a corresponding one of the cells of the battery pack to detect a voltage of the corresponding one of the cells. Each of the discharging circuits is connected in parallel to a corresponding one of the cells to selectively discharge an electric power of the corresponding one of the cells, each of the discharging circuits including a switch and a resistor that are connected in series. The switch drive circuit is connected to the switches of the discharging circuits to selectively turn on and off the switches. Each of the diagnostic voltage detecting circuits is electrically connected to a corresponding one of the discharging circuits to detect one of a voltage across a corresponding one of the switches and a voltage across a corresponding one of the resistors. The abnormality diagnostic control section is configured to control the switch drive circuit to perform a first diagnostic operation in which the switches corresponding to alternate ones of the cells are turned on and a second diagnostic operation in which all of the switches are turned on. The abnormality diagnostic control section is further configured to determine whether a break exists in an electrical connection between one of the cells and a corresponding one of the discharging circuits or an abnormality exists in one of the switches based on the voltages detected by the diagnostic voltage detecting circuits during the first diagnostic operation and the voltages detected by the diagnostic voltage detecting circuits during the second diagnostic operation.

These and other objects, features, aspects and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 1 is a schematic diagram of a battery pack provided with an abnormality diagnostic device in accordance with a first embodiment of the present invention;

FIG. 3 is a schematic diagram of the battery pack provided with the abnormality diagnostic device illustrating a case in which all of switches of the abnormality diagnostic device are turned on and there is a break in a line connected to a positive terminal of a highest cell of the battery pack in accordance with the first embodiment of the present invention;

FIG. 4 is a schematic diagram of the battery pack provided with the abnormality diagnostic device illustrating a case in which all of the switches are turned on and there is a break in a line connected to a terminal of a cell other than the highest cell of the battery pack in accordance with the first embodiment of the present invention;

FIG. 5 is a schematic diagram of the battery pack provided with the abnormality diagnostic device illustrating a case in which an abnormality exists in one of the switches such that the switch remains off even though an on-signal is being sent from an abnormality diagnostic section of the abnormality diagnostic device in accordance with the first embodiment of the present invention;

FIG. 6 is a table summarizing a method of distinguishing among the different types of abnormalities based on the control state of the switches, the resistor voltages, and the cell voltages in accordance with the first embodiment of the present invention;

FIG. 7 is a schematic diagram of a battery pack provided with an abnormality diagnostic device in which switch voltage detecting circuits are provided for detecting the voltages across the switches in accordance with a second embodiment of the present invention.

DETAILED DESCRIPTION OF THE PREFERRED EMBODIMENTS

Figure 2:
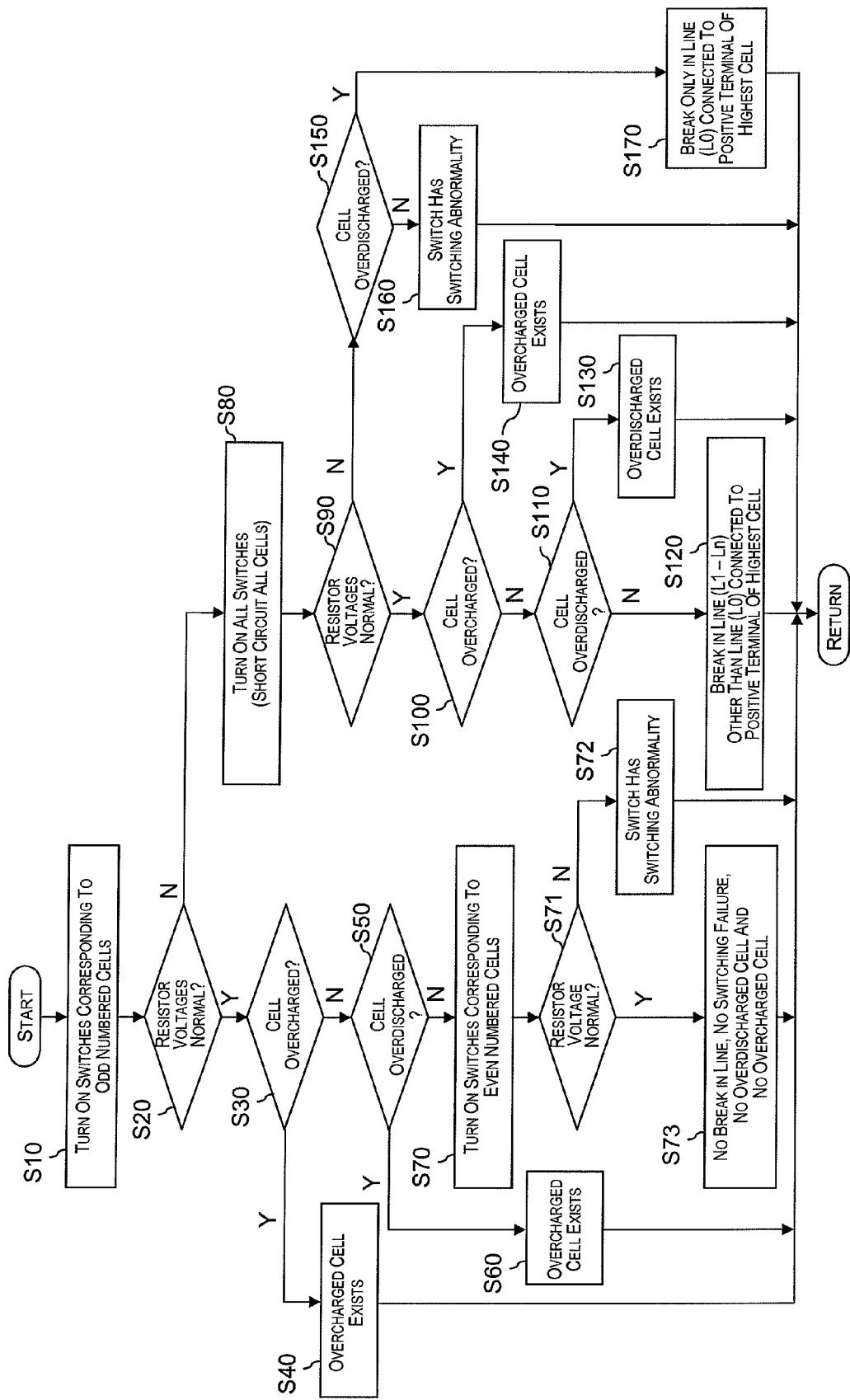
FIG. 2 is a flowchart showing a diagnostic processing executed by the abnormality diagnostic device in accordance with the first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring initially to FIG. 1, an abnormality diagnostic device is illustrated in accordance with a first embodiment of the present invention. FIG. 1 is schematic diagram of a battery pack 1 provided with the batter abnormality diagnostic device of the first embodiment. As shown in FIG. 1, the battery pack 1 includes a plurality of rechargeable cells (e.g., lithium battery cells) C1 to Cn (where "n" is a natural number) connected in series. The abnormality diagnostic device includes a plurality of switches SW1 to SWn and a plurality of resistors R1 to Rn. One of the switches SW1 to SW and a corresponding one of the resistors R1 to Rn are connected in series to form a discharging circuit, which is connected in parallel to a corresponding one of the cells C1 to Cn. For example, the discharging circuit, which has the switch SW1 and the resistor R1 that are connected together in series, is connected in parallel with the cell C1 as shown in FIG. 1. The switches SW1 to SWn include, for example, transistors. The abnormality diagnostic device further includes an abnormality diagnostic section 10 (abnormality diagnostic control section) including a switch drive circuit configured to selectively control the on/off states of the switches SW1 to SWn. The resistance values of the resistors R1 to Rn are all equal to one another.

As shown in FIG. 1, a line L0 connects between the positive electrode of the highest cell C1 and the switch SW1, and lines L1 to Ln connect between the negative electrode of the corresponding ones of the cells C1 to Cn and the corresponding ones of resistor R1 to Rn. In other words, the lines L0 to Ln are connection lines that serve to connect each of the cells C1 to Cn to a corresponding one of the discharging circuits that comprise the switches SW1 to SWn and the resistors R1 to Rn connected together in series. As used herein, "the highest cell" or "the highest ordered cell" refers to one of the cells of the battery pack that is electrically positioned at the positive electrode end of the serially connected cells (e.g., the cell C1 in the illustrated embodiment).

Moreover, the abnormality diagnostic device further includes a plurality of resistor voltage detecting circuits B1 to Bn (diagnostic voltage detecting circuits) provided with respect to each of the resistors R1 to Rn corresponding to each of the cells C1 to Cn. Each of the resistor voltage detecting circuits B1 to Bn is configured to detect the voltage across the corresponding one of the resistors R1 to Rn and to send the detected voltage value to the abnormality diagnostic section 10.

Furthermore, the abnormality diagnostic device includes a plurality of cell voltage detecting circuits D1 to Dn provided with respect to each of the cells C1 to Cn as shown in FIG. 1. Each of the cell voltage detecting circuits D1 to Dn is configured to detect the voltage of a corresponding one of the cells C1 to Cn and to send the detect voltage value to the abnormality diagnostic section 10.

The abnormality diagnostic section 10 preferably includes a microcomputer with an abnormality diagnostic control program as discussed below. The abnormality diagnostic section 10 can also include other conventional components such as an input interface circuit, an output interface circuit, and storage devices such as a ROM (Read Only Memory) device and a RAM (Random Access Memory) device. The microcomputer of the abnormality diagnostic section 10 is programmed to control the on/off states of switches SW1 to SW2. The memory circuit stores processing results and control programs that are run by the processor circuit. The abnormality diagnostic section 10 is operatively coupled to the switches SW1 to SWn, the resistor voltage detecting circuits B1 to Bn, the cell voltage detecting circuits D1 to Dn and other components in a conventional manner. The internal RAM of the abnormality diagnostic section 10 stores statuses of operational flags and various control data. The abnormality diagnostic section 10 is capable of selectively controlling any of the components of the control system in accordance with the control program. It will be apparent to those skilled in the art from this disclosure that the precise structure and algorithms for the abnormality diagnostic section 10 can be any combination of hardware and software that will carry out the functions of the present invention.

The abnormality diagnostic section 10 is configured to control the on/off states of the switches SW1 to SWn and to determine if there is an abnormality in the switches SW1 to SWn, if there is a break in the lines L0 to Ln, and if the cells C1 to Cn are overdischarged or overcharged based on the voltages received from the resistor voltage detecting circuits B1 to Bn and the voltages received from the cell voltage detecting circuits D1 to Dn. The method by which the abnormality diagnostic section 10 makes these determinations will be explained later.

The voltages of the cells C1 to Cn stay within a prescribed range due to the characteristics of a battery. In the first embodiment, the prescribed range is approximately 1.0 V (volt) to approximately 4.35 V. In other words, the cell voltage will not fall below 1.0 V and the cell voltage will not rise above 4.35 V. When the cells C1 to Cn are normal, the cell voltages will lie in another prescribed range (e.g., 2.0 V to 4.3 V). The abnormality diagnostic section 10 is configured to determine that one of the cells C1 to Cn is in an overdischarged state if the cell voltage detected by the corresponding cell voltage detecting circuit D1 to Dn is equal to or below a prescribed overdischarge threshold value V1 (e.g., 2.0 V) and that a cell is in an overcharged state if the detected cell voltage is equal to or above a prescribed overcharge threshold value V2 (e.g., 4.3 V).

The method of diagnosing an abnormality using the switches SW1 to SWn executed will now be explained. In this explanation, the switch SW1 will be used for the explanation, but the same method applies to the other switches SW2 to SWn, as well. When the switch SW1 is on, current flows from the cell C1 to the resistor R1 and the voltage across the resistor R1 becomes the voltage value obtained by subtracting the on-resistance voltage of the switch SW1 from the voltage of the cell C1. When the switch SW1 is turned off, current does not flow to the resistor R1 and the voltage across the resistor R1 becomes substantially 0 V.

The abnormality diagnostic section 10 is configured to determine if an abnormality or failure exists in the switch SW1 based on a control signal for turning the switch SW1 on and off and the voltage across the resistor R1 detected by the resistor voltage detecting circuit B1. More specifically, the abnormality diagnostic section 10 is configured to determine that the switch SW1 is normal if the voltage across the resistor R1 is in a prescribed range (e.g., from 1.0 V to 3.8 V) when control is executed to turn the switch SW1 on. Also, the abnormality diagnostic section 10 is configured to determine that the switch SW1 is normal if the voltage across the resistor R1 is equal to or smaller than a prescribed voltage V3 (e.g., 0.1 V) when control is executed to turn the switch SW1 off.

Even if the cell C1 is overcharged, e.g., charged to the maximum cell voltage of 4.35 V, the voltage across the resistor R1 will be within the prescribed voltage range when the switch SW1 is turned on, because the voltage value obtained by subtracting the on-resistance voltage of the switch SW1 from the cell voltage will be below 3.8 V (i.e., within the prescribed voltage range from 1.0 V to 3.8 V). Additionally, the voltage across the voltage R1 will be within the prescribed voltage range (i.e., above 1.0V) even if the cell C1 is overdischarged when the switch SW1 is turned on.

FIG. 2 is a flowchart for explaining a diagnostic processing executed by the abnormality diagnostic device in accordance with the first embodiment. The abnormality diagnostic section 10 is configured to start the control processing of step S10 at any timing to determine if there is an abnormality in the switches SW1 to SWn, if there is a break in the lines L0 to Ln, and if each cell is overdischarged or overcharged.

In step S10 (first diagnostic operation), the abnormality diagnostic section 10 is configured to issue a signal to turn on the switches SW1, SW3, etc., corresponding to alternate ones every other of the cells of the battery pack 1 (every other of the cells of the battery pack 1), starting from the highest cell C1. In other words, the abnormality diagnostic section 10 is configured to issue a signal serving to turn on the switches SW1, SW3, etc., which correspond to the odd numbered cells C1, C3, etc. On the other hand, the switches SW2, SW4, etc., corresponding to the even numbered cells C2, C4, C6, etc., remain off.

Then, in step S20 (diagnostic voltage detecting step), the abnormality diagnostic section 10 is configured to determine if the respective voltages across the resistors R1 to Rn (resistor voltages) are normal based on the voltage values received from the resistor voltage detecting circuits B1 to Bn. In other words, the resistor voltage of each of the resistors R1, R3, R5, etc. corresponding to the odd numbered switches SW1, SW3, etc. (which are turned on) is determined to be normal if the voltage across that resistor is in the prescribed voltage range (e.g., 1.0 V to 3.8 V). On the other hand, the resistor voltage of each of the resistors R2, R4, R6, etc. corresponding to the even numbered switches SW2, SW4, etc. (which are turned off) is determined to be normal if the voltage across that resistor is equal to or below the prescribed voltage V3 (e.g., 0.1 V). Once the voltages across the resistors R1 to Rn are detected, the abnormality diagnostic section 10 is preferably configured to turn off the switches SW1, SW3, etc., which correspond to the odd numbered cells C1, C3, etc.

If all of the resistor voltages are determined to be normal in step S20, then the abnormality diagnostic section 10 proceeds to step S30.

In step S30 (cell voltage detecting step), the abnormality diagnostic section 10 is configured to determine if any of the cell voltages detected by the cell voltage detecting circuits D1 to Dn is equal to or larger than the prescribed overcharge threshold value V2 (e.g., 4.3 V). If there is a cell voltage that is equal to or larger than the prescribed overcharge threshold value V2, then the abnormality diagnostic section 10 proceeds to step S40.

In step S40, the abnormality diagnostic section 10 determines that an overcharged cell exists. Under such circumstances, a user can be informed of the existence of the overcharged cell by, for example, illuminating an indicator lamp (not shown).

On the other hand, if the abnormality diagnostic section 10 determines that none the cell voltages detected by the cell voltage detecting circuits D1 to Dn is equal to or larger than the prescribed overcharge threshold value V2 (No in step S30), then the abnormality diagnostic section 10 proceeds to step S50.

In step S50, the abnormality diagnostic section 10 is configured to determine if any of the cell voltages detected by the cell voltage detecting circuits D1 to Dn is equal to or smaller than the prescribed overdischarge threshold value V1 (e.g., 2.0 V). If there is a cell voltage that is equal to or smaller than the prescribed overdischarge threshold value V1, then the abnormality diagnostic section 10 proceeds to step S60.

In step S60, the abnormality diagnostic section 10 determines that an overdischarged cell exists. Under such circumstances, a user can be informed of the existence of the overcharged cell by, for example, illuminating an indicator lamp (not shown).

On the other hand, if the abnormality diagnostic section 10 determines that none of the cell voltages detected by the cell voltage detecting circuits D1 to Dn is equal to or smaller than the prescribed overdischarge threshold value V1 (No in step S50), the abnormality diagnostic section 10 proceeds to step S70.

In step S70 (third diagnostic operation), the abnormality diagnostic section 10 is configured to issues a signal configured to turn on the switches SW2, SW4, etc., corresponding to the even numbered cells C2, C4, etc. On the other hand, the switches SW1, SW3, etc., corresponding to the odd numbered cells C1, C3, etc., remain off.

Then, in step S71, the abnormality diagnostic section 10 is configured to determine if the respective voltages across the resistors R1 to Rn (resistor voltages) are normal based on the voltage values received from the resistor voltage detecting circuits B1 to Bn. In other words, the resistor voltage of each of the resistors R2, R4, etc., corresponding to the even numbered switches SW2, SW4, etc. (which are turned on), is determined to be normal if the voltage across that resistor is in the prescribed voltage range (e.g., 1 V to 3.8 V). The resistor voltage of each of the resistors R1, R3, etc., corresponding to the odd numbered switches SW1, SW3, etc. (which are turned off), is determined to be normal if the voltage across that resistor is equal to or below the prescribed voltage V3 (e.g., 0.1 V).

If the abnormality diagnostic section 10 determines any one of the respective voltages across the resistors R1 to Rn (resistor voltages) is not normal (No in step S71), the abnormality diagnostic section 10 proceeds to step S72.

In step S72, the abnormality diagnostic section 10 is configured to determine that at least one of the odd numbered switches SW1, SW3, etc., has a switching abnormality (failure) that makes the switch unable to turn off or that at least one of the even numbered switches SW2, SW4, etc., has a switching abnormality (failure) that makes the switch unable to turn on. Under such circumstances, a user can be informed of the abnormality by, for example, illuminating an indicator lamp (not shown).

On the other hand, if the abnormality diagnostic section 10 determines the respective voltages across the resistors R1 to Rn (resistor voltages) are normal (Yes in step S71), then the abnormality diagnostic section 10 proceeds to step S73.

In step S73, the abnormality diagnostic section 10 determines that no break exists in the lines L0 to Ln, that no abnormality exists in the switches SW1 to SWn (i.e., all of the switches SW1 to SWn are normal), and that none of the cells C1 to Cn is overdischarged or overcharged.

In step S20, if the abnormality diagnostic section 10 determines that any one of the resistor voltages is not within the prescribed voltage range (e.g., 1 V to 3.8 V), the abnormality diagnostic section 10 proceeds to step S80. In such a case, one of the following types of abnormalities (1) to (4) exists: (1) there is a break in line L0; (2) there is a break in one of lines L1 to Ln; (3) one or more of the cells C1 to Cn are in an overdischarged state or an overcharged state; and (4) one or more of the switches SW1 to SWn are abnormal. In step S80 and subsequent steps, the abnormality diagnostic section 10 identifies which type of abnormality exists.

FIG. 3 is a schematic diagram illustrating a case in which all of the switches SW1 to SWn are on and there is a break in the line L0. In such a case, the voltage detected by the resistor voltage detecting circuit B1 is substantially 0 V. Thus, the voltage detected by the resistor voltage detecting circuit B1 is not within a voltage range (e.g., 1.0 V to 3.8 V) that is normal for when the switch SW1 is on. Additionally, since the voltage detected by the cell voltage detecting circuit D1 is substantially 0 V, the abnormality diagnostic section 10 determines that the voltage detected by the cell voltage detecting circuit D1 is equal to or below the prescribed overdischarge threshold value V1.

FIG. 4 is a schematic diagram illustrating a case in which all of the switches SW1 to SWn are on and there is a break in the line L2. Additionally, in this example, none of the cells C1 to Cn is overdischarged or overcharged (i.e., the cell voltages of all of the cells C1 to Cn are normal). When a break occurs in the line L2, current flows from the positive electrode of the cell C2 to the negative electrode of the cell C3 through the switch SW2, the resistor R2, the switch SW3, and the resistor R3. Under such conditions, since the average voltage of the cell C2 and the cell C3 acts on each of the resistors R2 and R3, the voltages detected by the resistor voltage detecting circuits B2 and B3 are both within the normal voltage range for when the switches SW2 and SW3 are on. Additionally, since the voltages detected by both of the cell voltage detecting circuits D2 and D3 are equal to the average of the voltages of the cell C2 and the cell C3, both detected voltages are higher than the prescribed overdischarge threshold value V1 and lower than the prescribed overcharge threshold value V2. Although the explanation just presented with reference to FIG. 4 describes the detected voltages that occur when a break occurs in the line L2, the same situation regarding the detected voltages occurs when a break occurs in any of the lines L1, L3, L4, . . . , Ln other than the line L0 connected to the positive terminal of the highest cell C1.

FIG. 5 is a schematic diagram illustrating a case in which an abnormality exists in the switch SW3 such that the switch SW3 remains off even though an on-signal is being sent from the abnormality diagnostic section 10. All of the switches other than the switch SW3 are on as shown in FIG. 5. Additionally, in this example, none of the cells C1 to Cn is overdischarged or overcharged (i.e., the cell voltages of all of the cells C1 to Cn are normal). In such a case, the voltage detected by the resistor voltage detecting circuit B3 is substantially 0 V, and thus, is not within the normal voltage range for when the switch SW3 is on. Additionally, since the voltage detected by the cell voltage detecting circuit D3 is equal to the voltage of the cell C3, the detected cell voltage is higher than the prescribed overdischarge threshold value V1 and lower than the prescribed overcharge threshold value V2. Although the explanation just presented with reference to FIG. 5 describes the detected voltages that occur when an abnormality occurs in the switch SW3, the same situation regarding the detected voltages occurs when an abnormality occurs in any of the switches SW1, SW2, SW4, . . . , SWn.

As explained above, when one of the cells C1 to Cn is in an overdischarged state, the voltage detected by one of the cell voltage detecting circuits D1 to Dn corresponding to the overdischarged cell is equal to or below the prescribed overdischarge threshold value V1 (e.g., 2.0 V). Similarly, when a cell is in an overcharged state, the voltage detected by the cell voltage detecting circuit corresponding to the overdischarged cell is equal to or above a prescribed overcharge threshold value V2 (e.g., 4.3 V). Even if a cell is overdischarged or overcharged, the resistor voltage detected by the resistor voltage detecting circuit will be within the normal voltage range for when the switch is on (e.g., from 1.0 V to 3.8 V).

Referring back to the flowchart of FIG. 2, in step S80 (second diagnostic operation), the abnormality diagnostic section 10 is configured to issue a signal to turn all of the switches SW1 to SWn on. Then, the abnormality diagnostic section 10 proceeds to step S90.

In step S90, the abnormality diagnostic section 10 is configured to determine if the respective voltages across the resistors R1 to Rn (resistor voltages) are normal based on the voltage values received from each of the resistor voltage detecting circuits B1 to Bn. In other words, the abnormality diagnostic section 10 is configured to determine that the resistor voltages of the resistors are normal if the voltage detected by each of the resistor voltage detecting circuits B1 to Bn is within a prescribed voltage range (e.g., 1.0 V to 3.8 V). If any of the detected resistor voltages is not within the prescribed voltage range in step S90 (No in step S90), then the abnormality diagnostic section 10 determines that there is an abnormal resistor voltage, and thus, the abnormality diagnostic section 10 proceeds to step S150. On the other hand, if the abnormality diagnostic section 10 determines that the resistor voltages are normal in step S90 (Yes in step S90), then the abnormality diagnostic section 10 proceeds to step S100.

In step S100, the abnormality diagnostic section 10 is configured to determine if any of the cell voltages detected by the cell voltage detecting circuits D1 to Dn is equal to or larger than the prescribed overcharge threshold value V2 (e.g., 4.3 V). If the abnormality diagnostic section 10 determines that all of the detected cell voltages are smaller than the prescribed overcharge threshold value V2 in step S100 (No in step S100), then the abnormality diagnostic section 10 proceeds to step S110. On the other hand, if the abnormality diagnostic section 10 determines that any one of the detected cell voltages is equal to or larger than the prescribed overcharge threshold value V2 (Yes in step S100), then the abnormality diagnostic section 10 proceeds to step S140.

In step S140, the abnormality diagnostic section 10 determines that an overcharged cell exists. Under such circumstances, a user can be informed of the abnormality by, for example, illuminating an indicator lamp (not shown).

In step S110, the abnormality diagnostic section 10 is configured to determine if any of the cell voltages detected by the cell voltage detecting circuits D1 to Dn is equal to or smaller than the prescribed overdischarge threshold value V1 (e.g., 2.0 V). If the abnormality diagnostic section 10 determines that all of the detected cell voltages are larger than the prescribed overdischarge threshold value V1 (No in step S110), then the abnormality diagnostic section 10 proceeds to step S120. On the other hand, if the abnormality diagnostic section 10 determines that any one of the detected cell voltages is equal to or smaller than the prescribed overdischarge threshold value V1 (Yes in step S110), then the abnormality diagnostic section 10 proceeds to step S130.

In step S130, the abnormality diagnostic section 10 determines that an overdischarged cell exists. Under such circumstances, a user can be informed of the abnormality by, for example, illuminating an indicator lamp (not shown).

In step S120, the abnormality diagnostic section 10 determines there is a break in any of the lines L1 to Ln, i.e., the lines other than the highest line L0 connected to the positive terminal of the highest cell C1, as explained previously with reference to FIG. 4. Under such circumstances, a user can be informed of the abnormality by, for example, illuminating an indicator lamp (not shown).

On the other hand, in step S150, the abnormality diagnostic section 10 is configured to determine if any of the cell voltages detected by the cell voltage detecting circuits D1 to Dn is equal to or smaller than the prescribed overdischarge threshold value V1 (e.g., 2.0 V). If the abnormality diagnostic section 10 determines that all of the detected cell voltages are larger than the prescribed overdischarge threshold value V1 (No in step S150), then the abnormality diagnostic section 10 proceeds to step S160. On the other hand, if the abnormality diagnostic section 10 determines that any of the detected cell voltages is equal to or smaller than the prescribed overdischarge threshold value V1 (Yes in step S150), then the abnormality diagnostic section 10 proceeds to step S170.

In step S160, as explained previously with reference to FIG. 5, the abnormality diagnostic section 10 determines that an abnormality has occurred in at least one of the switches SW1 to SWn. Under such circumstances, a user can be informed of the abnormality by, for example, illuminating an indicator lamp (not shown).

In step S170, as explained previously with reference to FIG. 3, the abnormality diagnostic section 10 determines that a break has occurred in the highest line L0 that is connected to the positive terminal of the highest cell C1. Under such circumstances, a user can be informed of the abnormality by, for example, illuminating an indicator lamp (not shown).

FIG. 6 is a table summarizing the method of distinguishing among the different types of abnormalities based on the control state of the switches SW1 to SWn, the resistor voltages, and the cell voltages. The types of abnormality include a switching abnormality of any of the switches SW1 to SWn, a break in the line L0 connected to the positive electrode of the highest cell C1, a brake in any of the lines L1 to Ln, and an overdischarge of any of the cells C1 to Cn and an overcharge of any of the cells C1 to Cn.

The abnormality diagnostic device in accordance with the first embodiment has the discharging circuits, each including one of the switches SW1 to SWn and one of the resistors R1 to Rn connected in parallel with one of the cells C1 to Cn of the battery pack 1. Each pair of the switches SW1 to SWn and the resistors R1 to Rn is connected in series. With the abnormality diagnostic device in accordance with the first embodiment, voltage abnormalities of the cells C1 to Cn, breaks in electrical connections between the cells C1 to Cn and corresponding discharging circuits, and switching abnormalities of the switches SW1 to SWn of the discharging circuits are detected and identified based on the control states of the switches SW1 to SWn, the voltages of the cells C1 to Cn, and the voltages across (between the terminals of) the resistors R1 to Rn of the discharging circuits. In this way, voltage abnormalities of the cells C1 to Cn, breaks in electrical connections, and switching abnormalities of the switches SW1 to SWn can be detected and identified according to abnormality types.

In particular, the abnormality diagnostic device in accordance with the first embodiment is configured to determine that a break in electrical connection does not exist in any of the connection lines L0 to Ln if each of the resistor voltages is within the prescribed normal voltage range (e.g., 1.0 V to 3.8 V) in accordance with the on/off state of the corresponding switch SW1 to SWn when the on/off states of the switches SW1 to SWn are being controlled so as to short circuit alternate ones of the cells C1 to Cn. In this way, when a break in electrical connection does not exist, the fact that a break in electrical connection does not exist can be detected in a reliable manner.

The abnormality diagnostic device in accordance with the first embodiment is also configured to determine that a cell voltage abnormality (overcharged or overdischarged) exists or that a break in electrical connection exists in one of the connection lines L1 to Ln other than the connection line L0 connected to the positive terminal of the highest cell if any of the resistor voltages is not within the prescribed normal voltage range (e.g., 1.0 V to 3.8 V) when the on/off states of the switches SW1 to SWn are being controlled so as to short circuit alternate ones of the cells C1 to Cn and all of the resistor voltages are within the prescribed normal voltage range after all of the switches SW1 to SWn have been turned on. More specifically, if any of the cell voltages is equal to or larger than a prescribed overcharge threshold value V2 (e.g., 4.3 V) when all of the switches SW1 to SWn are turned on such that all of the cells C1 to Cn are short circuited, then the abnormality diagnostic device determines that an overcharged cell exists. On the other hand, if any of the cell voltages is equal to or smaller than a prescribed overdischarge threshold value V1 (e.g., 2.0 V), then the abnormality diagnostic device determines that an overdischarged cell exists. Additionally, if the cell voltages are all smaller than the prescribed overcharge threshold value V2 and larger than the prescribed overdischarge threshold value V1, the abnormality diagnostic device determines that a break exists in one of the connection lines L1 to Ln other than the connection line L0 that connects to the positive terminal of the highest cell C1. In this way, existence of an overcharged cell, existence of an overdischarged cell, and a break in a connection line L1 to Ln other than the connection line L0 that connects to the positive electrode of the highest cell C1 can each be detected in a reliable fashion.

The abnormality diagnostic device in accordance with the first embodiment is configured to determine that a switching abnormality exists in the switches SW1 to SWn or that a break in electrical connection exists in the connection line L0 connected to the positive terminal of the highest cell C1 if any of the resistor voltages is not within the prescribed voltage range (e.g., from 1.0 V to 3.8 V) when the on/off states of all of the switches SW1 to SWn are being controlled to the on-state such that all of the cells C1 to Cn are short circuited. More specifically, if a cell voltage is equal to or below the prescribed overdischarge threshold value V1 (e.g., 2.0 V) when all of the switches SW1 to SWn are turned on such that all of the cells are short circuited, then the abnormality diagnostic device determines that a break exists in the connection line L0 connected to the positive electrode of the highest cell C1. In this way, a brake in the connection line L0 connected to the positive electrode of the highest cell C1 can be detected in a reliable manner. On the other hand, if all of the cell voltages are higher than the prescribed overdischarge threshold value when all of the switches SW1 to SWn are turned on such that all of the cells C1 to Cn are short circuited, then the abnormality diagnostic device determines that a switching abnormality exists in the switches SW1 to SWn. In this way, a switching abnormality in the switches SW1 to SWn can be detected in a reliable manner.

Since the first embodiment of the present invention enables an abnormality to be detected and identified as a break in one of the lines L0 to Ln, an abnormality in one of the switches SW1 to SWn, and an overdischarged or overcharged cell, it is possible not only to inform a user by, for example, illuminating an indicator, but also to change the operation of the battery to accommodate the particular abnormality that has occurred.

For example, if a break has occurred in one of the lines L0 to Ln, then the voltage across the cell corresponding to the disconnected line cannot be detected and it is necessary to prohibit or limit consumption of electric power from the battery pack 1 or charging of the battery pack 1. On the other hand, if an abnormality has occurred in any of the switches SW1 to SWn, the voltages across the cells C1 to Cn can be detected and it is possible to continue consuming electric power from the battery pack 1 or charging the battery pack 1 so long as the voltages of the cells C1 to Cn are normal. In such a case, it is feasible instead to, for example, limit the amount of electric power and urge the user to have the battery pack 1 repaired. In other words, depending on the type of abnormality, it may not be necessary to prohibit consumption of electric power from the battery pack 1 or charging of the battery pack 1. Since consumption of electric power from the battery pack 1 or charging of the battery pack 1 can be continued in such a case (e.g., when the switching abnormality exists in one of the switches SW1 to SWn), the first embodiment of the present invention provides a favorable effect from a user's perspective.

Second Embodiment

Figure 8:
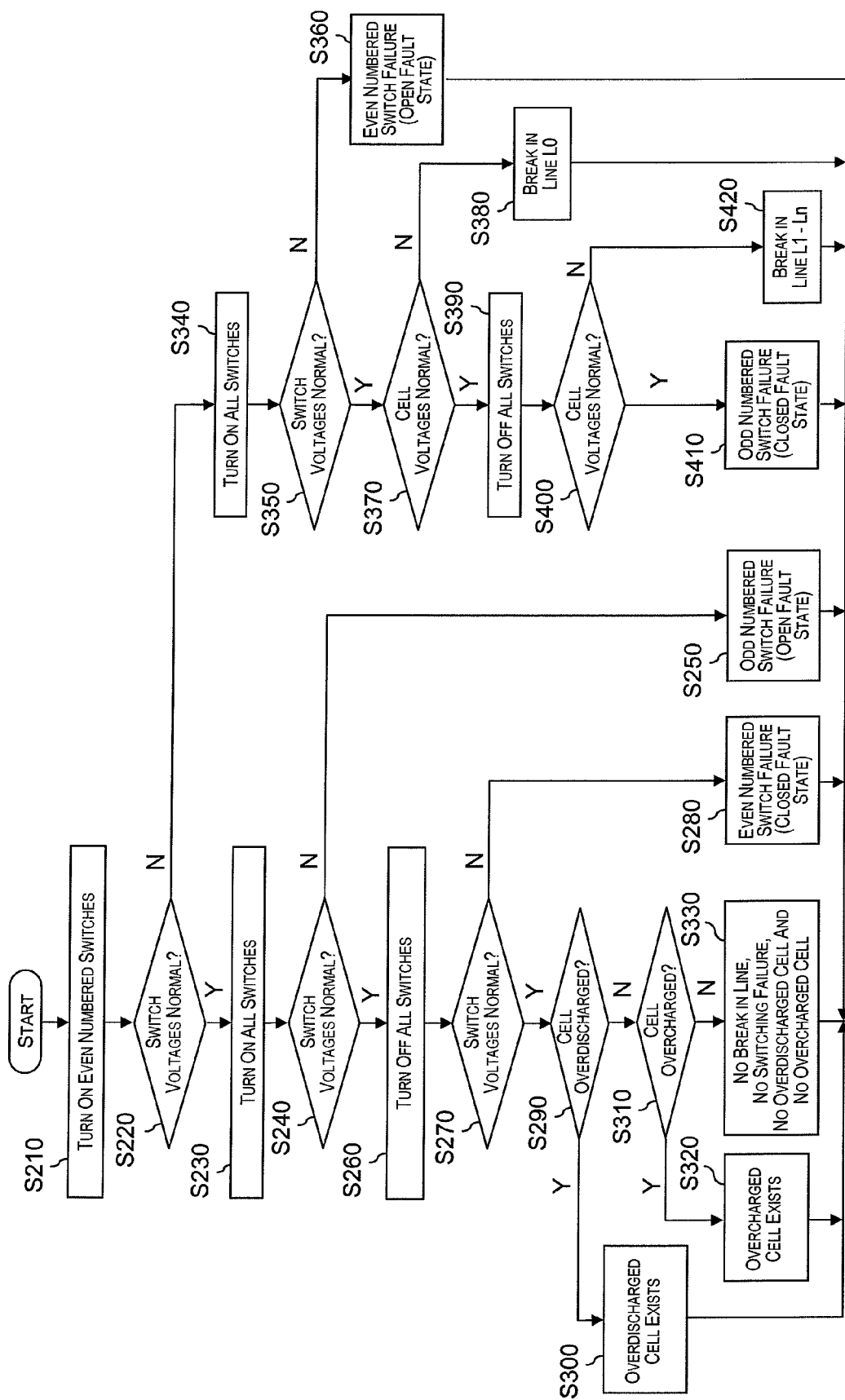
FIG. 8 is a flowchart showing a diagnostic processing executed by the abnormality diagnostic device in accordance with the second embodiment of the present invention.

Referring now to FIGS. 7 and 8, an abnormality diagnostic device in accordance with a second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity. The parts of the second embodiment that differ from the parts of the first embodiment will be indicated with a single prime (').

The abnormality diagnostic device of the second embodiment differs from the abnormality diagnostic device of the first embodiment in that the abnormality diagnostic device of the second embodiment includes a plurality of switch voltage detecting circuits E1 to En (diagnostic voltage detecting circuits) configured to detect the voltages across the switches SW1 to SWn instead of the voltages across the resistors R1 to Rn, while, in the abnormality diagnostic device of the first embodiment, the voltages across the resistors R1 to Rn were detected by the resistor voltage detecting circuits B1 to Bn.

FIG. 7 is a schematic diagram of the battery pack 1 provided with the abnormality diagnostic device according to the second embodiment.

FIG. 8 is a flowchart showing a diagnostic processing executed by the abnormality diagnostic device of the second embodiment shown in FIG. 7. An abnormality diagnostic section 10' of the second embodiment is configured to start the diagnostic processing shown in FIG. 8 at any timing to determine if there is an abnormality in the switches SW1 to SWn, if there is a break in the lines L0 to Ln, and if each cell is overdischarged or overcharged.

In step S210, the abnormality diagnostic section 10' is configured to send a signal to turn on the switches SW2, SW4, etc. corresponding to alternate ones of the cells C1 to Cn (every other of the cells C1 to Cn) of the battery pack 1, starting from the next cell after the highest cell C1. In other words, in the second embodiment, the abnormality diagnostic section 10' is configured to send signals to turn on the switches SW2, SW4, etc., corresponding to the even numbered cells C2, C4, etc, (first diagnostic operation). On the other hand, the switches SW1, SW3, etc., corresponding to the odd numbered cells C1, C3, etc., remain off.

Then, in step S220, the abnormality diagnostic section 10' is configured to determine if the respective voltages across the switches SW1 to SWn (switch voltages) are normal based on the voltage values detected by the switch voltage detecting circuits E1 to En. More specifically, the abnormality diagnostic section 10' is configured to determine that the switch voltages are normal if the voltages of all of the even numbered switches SW2, SW4, etc., (which are turned on) are equal to or below a prescribed voltage (e.g., 1.0 V) and the voltages of all of the odd numbered switches SW1, SW3, etc., (which are turned off) are higher than the prescribed voltage.

If the abnormality diagnostic section 10' determines that all of the switch voltages are normal in step S220 (Yes in step S220), then the abnormality diagnostic section 10' proceeds to step S230.

In step S230 (second diagnostic operation), the abnormality diagnostic section 10' is configured to turn on all of the switches SW1 to SWn.

Then, in step S240, the abnormality diagnostic section 10' is configured to receive the switch voltages of the switches SW1 to SWn detected by the switch voltage detecting circuits E1 to En. If all of the switch voltages are equal to or below the prescribed voltage (e.g., 1.0 V) in step S240 (Yes in step S240), then the abnormality diagnostic section 10' determines that the switch voltages are normal and proceeds to step S260. On the other hand, if any of the switch voltages is higher than the aforementioned prescribed voltage in step S240 (No in step S240), then the abnormality diagnostic section 10' determines that a switch voltage is abnormal and proceeds to step S250.

In step S250, the abnormality diagnostic section 10' determines that all of the switch voltages are normal (Yes in step S220) when the even numbered switches SW2, SW4, etc., are turned on and the odd numbered switches SW1, SW3, etc., are turned off but a switch voltage is discovered to be abnormal (No in step S240) when all of the switches SW1 to SWn are turned on. Therefore, the abnormality diagnostic section 10' determines that at least one of the odd numbered switches SW1, SW3, etc., is in an open fault state in which it cannot turn on (i.e., it cannot close). Thus, the abnormality diagnostic section 10' also informs the user of the abnormality by, for example, illuminating an indicator (not shown).

On the other hand, if the abnormality diagnostic section 10' determines that all of the switch voltages are normal in step S240 (Yes in step S240), then the abnormality diagnostic section 10' proceeds to step S260.

In step S260 (third diagnostic operation), the abnormality diagnostic section 10' is configured to turn all of the switches SW1 to SWn off.

Then, in step S270, the abnormality diagnostic section 10' is configured to receive the switch voltages of the switches SW1 to SWn detected by the switch voltage detecting circuits E1 to En. If all of the switch voltages are higher than the prescribed voltage (e.g., 1.0 V) (Yes in step S270), then the abnormality diagnostic section 10' determines that the switch voltages are normal and proceeds to step S290. On the other hand, if any of the switch voltages is equal to or below than the aforementioned prescribed voltage (No in step S270), then the abnormality diagnostic section 10' determines that a switch voltage is abnormal and proceeds to step S280.

In step S280, the abnormality diagnostic section 10' determines that at least one of the even numbered switches SW2, SW4, etc., is in a closed fault state in which it cannot turn off (i.e., it cannot open). Thus, the abnormality diagnostic section 10' is configured to inform the user of the abnormality by, for example, illuminating an indicator (not shown).

On the other hand, in step S290, the abnormality diagnostic section 10' is configured to determine if any of the cell voltages detected by the cell voltage detecting circuits D1 to Dn is equal to or smaller than a prescribed overdischarge threshold value V1 (e.g., 2.0 V). If there is a cell voltage that is equal to or smaller than the prescribed overdischarge threshold value V1 (Yes in step S290), then the abnormality diagnostic section 10' proceeds to step S300.

In step S300, the abnormality diagnostic section 10' determines that an overdischarged cell exists and informs the user of the abnormality by, for example, illuminating an indicator (not shown).

If the abnormality diagnostic section 10' determines in step S290 that all of the cell voltages are higher than the prescribed overdischarge threshold value V1 (No in step S290), then the abnormality diagnostic section 10' determines that none of the cells is in an overdischarged state and proceeds to step S310.

In step S310, the abnormality diagnostic section 10' is configured to determine if any of the cell voltages detected by the cell voltage detecting circuits D1 to Dn is equal to or larger than a prescribed overcharge threshold value V2 (e.g., 4.3 V). If there is a cell voltage that is equal to or larger than the prescribed overcharge threshold value V2 (Yes in step S310), then the abnormality diagnostic section 10' proceeds to step S320.

In step S320, the abnormality diagnostic section 10' determines that an overcharged cell exists and informs the user of the abnormality by, for example, illuminating an indicator (not shown).

If the abnormality diagnostic section 10' determines in step S310 that all of the cell voltages are lower than the prescribed overcharge threshold value V2 (No in step S310), then the abnormality diagnostic section 10' determines that none of the cells is in an overcharged state and proceeds to step S330.

In step S330, the abnormality diagnostic section 10' determines that the battery pack 1 is in a normal state in which there are no breaks in the lines L0 to Ln, no switching abnormalities in the switches SW1 to SWn, and no cells that are overdischarged or overcharged.

Referring back to step S220, if the abnormality diagnostic section 10' determines in step S220 that any of the switch voltages is abnormal (No in step S220), then the abnormality diagnostic section 10' proceeds to step S340.

In step S340, the abnormality diagnostic section 10' is configured to turn all of the switches SW1 to SWn on.

Then, in step S350, the abnormality diagnostic section 10' is configured to determine if any of the switch voltages detected by the switch voltage detecting circuits E1 to En is higher than the prescribed voltage (e.g., 1.0 V). If the abnormality diagnostic section 10' determines that any of the switch voltages is higher than the prescribed voltage (No in step S350), then the abnormality diagnostic section 10' determines that there is an abnormal switch voltage and proceeds to step S360.

In step S360, the abnormality diagnostic section 10' determines that at least one of the even numbered switches SW2, SW4, etc., is in an open fault state in which it cannot turn on (i.e., it cannot close). Then, the abnormality diagnostic section 10' is configured to inform the user of the abnormality by, for example, illuminating an indicator (not shown).

On the other hand, if the abnormality diagnostic section 10' determines in step S350 that all of the switch voltages are normal (Yes in step S350), then the abnormality diagnostic section 10' proceeds to step S370.

In step S370, the abnormality diagnostic section 10' is configured to determine if all of the cell voltages detected by the cell voltage detecting circuits E1 to En are within a prescribed range (e.g., 2.0 V to 4.3 V). If any of the cell voltages is outside the prescribed range (No in step S370), then the abnormality diagnostic section 10' determines that there is an abnormal cell voltage and proceeds to step S380.

In step S380, the abnormality diagnostic section 10' determines that all of the switch voltages are normal (Yes in step S350) but there is a cell voltage that is not within the prescribed range when all of the switches SW1 to SWn are on (No in step S370). Therefore, in step S380, the abnormality diagnostic section 10' determines that there is a break in the line L0 connected to the positive terminal of the highest cell C1. Therefore, the abnormality diagnostic section 10' is configured to inform the user of the abnormality by, for example, illuminating an indicator (not shown).

On the other hand, if the abnormality diagnostic section 10' determines in step S370 that all of the cell voltages are within the prescribed range and are thus normal (Yes in step S370), then the abnormality diagnostic section 10' proceeds to step S390.

In step S390 (third diagnostic operation), the abnormality diagnostic section 10' is configured to turn all of the switches SW1 to SWn off.

Then, in step S400, the abnormality diagnostic section 10' is configured to determine if all of the cell voltages detected by the cell voltage detecting circuits D1 to Dn are normal, i.e., within the aforementioned prescribed range. If all of the cell voltages are normal (Yes in step S400), then the abnormality diagnostic section 10' proceeds to step S410.

In step S410, the abnormality diagnostic section 10' determines that at least one of the odd numbered switches SW1, SW3, etc., is in a closed fault state in which it cannot turn off (i.e., it cannot open). Thus, the abnormality diagnostic section 10' is configured to inform the user of the abnormality by, for example, illuminating an indicator (not shown).

On the other hand, if the abnormality diagnostic section 10' determines in step S400 that any of the cell voltages are abnormal (No in step S400), then the abnormality diagnostic section 10' proceeds to step S420.

In step S420, the abnormality diagnostic section 10' is configured to determine that a break exists in one of the lines L1 to Ln other than the line L0 connected to the positive electrode of the highest cell C1. Thus, the abnormality diagnostic section 10' is configured to inform the user of the abnormality by, for example, illuminating an indicator (not shown).

Although in the first and second embodiments it is assumed that the cells C1 to Cn making up the battery pack 1 are lithium ion cells, it is also possible to use another type of cell. Furthermore, the threshold values to which the cell voltages and resistor voltages are compared are not limited to the values mentioned in the illustrated explanations. Rather, the threshold values can be appropriately determined according to the various conditions such as the specification of the cells used in the battery pack.

The abnormality diagnostic device in accordance with the illustrated embodiments of the present invention can be employed in system that uses a battery. For example, the abnormality diagnostic device in accordance with the illustrated embodiments of the present invention can be employed in a hybrid vehicle, an electric vehicle, a fuel cell vehicle, or a system other than a vehicle that uses a battery.

Accordingly, with the abnormality diagnostic device in accordance with the present invention, voltage abnormalities of the cells C1 to Cn, breaks in electrical connections, and switching abnormalities of the switches SW1 and SWn can be detected and identified.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. The term "detect" as used herein to describe an operation or function carried out by a component, a section, a device or the like includes a component, a section, a device or the like that does not require physical detection, but rather includes determining, measuring, modeling, predicting or computing or the like to carry out the operation or function. The term "configured" as used herein to describe a component, section or part of a device includes hardware and/or software that is constructed and/or programmed to carry out the desired function.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. An abnormality diagnostic device for diagnosing an abnormality in a battery pack having a plurality of cells connected in series, the abnormality diagnostic device comprising:
 a plurality of cell voltage detecting circuits with each of the cell voltage detecting circuits being connected in parallel to a corresponding one of the cells of the battery pack to detect a voltage of the corresponding one of the cells;
 a plurality of discharging circuits with each of the discharging circuits being connected in parallel to a corresponding one of the cells to selectively discharge an electric power of the corresponding one of the cells, each of the discharging circuits including a switch and a resistor that are connected in series;
 a switch drive circuit connected to the switches of the discharging circuits to selectively turn on and off the switches;
 a plurality of diagnostic voltage detecting circuits with each of the diagnostic voltage detecting circuits being electrically connected to a corresponding one of the discharging circuits to detect a voltage across the corresponding one of the discharging circuits; and
 an abnormality diagnostic control section configured
  to control the switch drive circuit to perform a first diagnostic operation in which the switches corresponding to either alternate even numbered ones of the cells or odd numbered ones of the cells are turned on simultaneously and a second diagnostic operation in which all of the switches of the discharging circuits are turned on simultaneously, and
  to determine whether a break exists in an electrical connection between one of the cells and a corresponding one of the discharging circuits and whether an abnormality exists in one of the switches based on the voltages detected by the diagnostic voltage detecting circuits during the first diagnostic operation and the voltages detected by the diagnostic voltage detecting circuits during the second diagnostic operation.

2. The abnormality diagnostic device as recited in claim 1, wherein
 each of the diagnostic voltage detecting circuits is configured to detect the voltage across a corresponding one of the resistors, and
 the abnormality diagnostic control section is further configured
  to control the switch drive circuit to turn on the switches corresponding to the odd numbered ones of the cells counted from a highest ordered one of the cells during the first diagnostic operation,
  to determine that the break exists in the electrical connection when one of the voltages detected by the diagnostic voltage detecting circuits is abnormal during the first diagnostic operation and when one of the voltages detected by the diagnostic voltage detecting circuits is abnormal and one of the voltages detected by the cell voltage detecting circuits is abnormal during the second diagnostic operation, and
  to determine that the abnormality exists in one of the switches when one of the voltages detected by the diagnostic voltage detecting circuits is abnormal during the first diagnostic operation and when one of the voltages detected by the diagnostic voltage detecting circuits is abnormal and all of the voltages detected by the cell voltage detecting circuits are normal during the second diagnostic operation.

3. The abnormality diagnostic device as recited in claim 1, wherein
 each of the diagnostic voltage detecting circuits is configured to detect the voltage across a corresponding one of the resistors, and
 the abnormality diagnostic control section is further configured
  to control the switch drive circuit to turn on the switches corresponding to the odd numbered ones of the cells counted from a highest ordered one of the cells during the first diagnostic operation, and
  to determine that the break exists in the electrical connection when one of the voltages detected by the diagnostic voltage detecting circuits is abnormal during the first diagnostic operation and when all of the voltages detected by the diagnostic voltage detecting circuits are normal and all of the voltages detected by the cell voltage detecting circuits are normal during the second diagnostic operation.

4. The abnormality diagnostic device as recited in claim 1, wherein
each of the diagnostic voltage detecting circuits is configured to detect the voltage across a corresponding one of the resistors, and
the abnormality diagnostic control section is further configured
to control the switch drive circuit to turn on the switches corresponding to the odd numbered ones of the cells counted from a highest ordered one of the cells during the first diagnostic operation,
to control the switch drive circuit to perform a third diagnostic operation in which the switches corresponding to the even numbered ones of the cells are turned on,
to determine that the abnormality exists in one of the switches when all of the voltages detected by the diagnostic voltage detecting circuits are normal during the first diagnostic operation and when one of the voltages detected by the diagnostic voltage detecting circuits is abnormal during the third diagnostic operation, and
to determine that no abnormality in the switches and no break in the electrical connection exist when all of the voltages detected by the diagnostic voltage detecting circuits are normal during the first and third diagnostic operations.

5. The abnormality diagnostic device as recited in claim 1, wherein
each of the diagnostic voltage detecting circuits is configured to detect the voltage across a corresponding one of the switches, and
the abnormality diagnostic control section is further configured
to control the switch drive circuit to turn on the switches corresponding to the even numbered ones of the cells counted from a highest ordered one of the cells during the first diagnostic operation,
to determine that the abnormality in one of the switches exists when one of the voltages detected by the diagnostic voltage detecting circuits is abnormal during the first diagnostic operation and when one of the voltages detected by the diagnostic voltage detecting circuits is abnormal during the second diagnostic operation, and
to determine the break in the electrical connection exists when one of the voltages detected by the diagnostic voltage detecting circuits is abnormal during the first diagnostic operation and when all of the voltages detected by the diagnostic voltage detecting circuits are normal and one of the voltages detected by the cell voltage detecting circuits is abnormal during the second diagnostic operation.

6. The abnormality diagnostic device as recited in claim 1, wherein
each of the diagnostic voltage detecting circuits is configured to detect the voltage across a corresponding one of the switches, and
the abnormality diagnostic control section is further configured
to control the switch drive circuit to turn on the switches corresponding to the even numbered ones of the cells counted from a highest ordered one of the cells during the first diagnostic operation,
to control the switch drive circuit to perform a third diagnostic operation in which all of the switches are turned off,
to determine that the abnormality exists in one of the switches when one of the voltages detected by the diagnostic voltage detecting circuits is abnormal during the first diagnostic operation when all of the voltages detected by the diagnostic voltage detecting circuits are normal and all of the voltages detected by the cell voltage detecting circuits are normal during the second diagnostic operation, and when all of the voltages detected by the cell voltage detecting circuits are normal during the third diagnostic operation, and
to determine that the break exists in the electrical connection when one of the voltages detected by the diagnostic voltage detecting circuits is abnormal during the first diagnostic operation, when all of the voltages detected by the diagnostic voltage detecting circuits are normal and all of the voltages detected by the cell voltage detecting circuits are normal during the second diagnostic operation, and when one of the voltages detected by the cell voltage detecting circuits is abnormal during the third diagnostic operation.

7. The abnormality diagnostic device as recited in claim 1, wherein
each of the diagnostic voltage detecting circuits is configured to detect the voltage across a corresponding one of the switches, and
the abnormality diagnostic control section is further configured
to control the switch drive circuit to turn on the switches corresponding to the even numbered ones of the cells counted from a highest ordered one of the cells during the first diagnostic operation, and
to determine that the abnormality exists in one of the switches when all of the voltages detected by the diagnostic voltage detecting circuits are normal during the first diagnostic operation and when one of the voltages detected by the diagnostic voltage detecting circuits is abnormal during the second diagnostic operation.

8. The abnormality diagnostic device as recited in claim 1, wherein
each of the diagnostic voltage detecting circuits is configured to detect the voltage across a corresponding one of the switches, and
the abnormality diagnostic control section is further configured to control the switch drive circuit to turn on the switches corresponding to the even numbered ones of the cells counted from a highest ordered one of the cells during the first diagnostic operation,
to control the switch drive circuit to perform a third diagnostic operation in which all of the switches are turned off,
to determine that the abnormality exists in one of the switches when all of the voltages detected by the diagnostic voltage detecting circuits are normal during the first diagnostic operation, when all of the voltages detected by the diagnostic voltage detecting circuits are normal during the second diagnostic operation, and when one of the voltages detected by the diagnostic voltage detecting circuits is abnormal during the third diagnostic operation, and
to determine no abnormality in the switches and no break in the electrical connection exist when all of the voltages detected by the diagnostic voltage detecting circuits and all of the voltages detected by the cell voltage detecting circuits are normal during the first, second and third diagnostic operations.

9. An abnormality diagnostic method for diagnosing an abnormality in a battery pack having a plurality of cells connected in series, the abnormality diagnostic method comprising:

providing a plurality of discharging circuits with each of the discharging circuits being connected in parallel to a corresponding one of the cells of the battery pack to selectively discharge an electric power of the corresponding one of the cells, each of the discharging circuits including a switch and a resistor that are connected in series;

performing a first diagnostic operation to turn on simultaneously the switches corresponding to either alternate even numbered ones of the cells or odd numbered ones of the cells;

performing a second diagnostic operation to turn on simultaneously all of the switches of the discharging circuits;

detecting cell voltages of the cells of the battery pack;

detecting discharging circuit voltages across the discharging circuits; and determining whether a break exists in an electrical connection between one of the cells and a corresponding one of the discharging circuits and whether an abnormality exists in one of the switches based on the discharging circuit voltages and the cell voltages detected during the first diagnostic operation and the discharging circuit voltages and the cell voltages detected during the second diagnostic operation.

10. The abnormality diagnostic method as recited in claim 9, wherein the detecting of the discharging circuit voltages includes detecting voltages across each of the resistors, and the performing of the first diagnostic operation includes turning on the switches corresponding to the odd numbered ones of the cells counted from a highest ordered one of the cells.

11. The abnormality diagnostic method as recited in claim 10, wherein the determining of whether the break exists in the electrical connection or the abnormality exists in one of the switches includes determining that the break exists in the electrical connection when one of the discharging circuit voltages is abnormal during the first diagnostic operation and when one of the discharging circuit voltages is abnormal and one of the cell voltages is abnormal during the second diagnostic operation, and determining that the abnormality exists in one of the switches when one of the discharging circuit voltages is abnormal during the first diagnostic operation and when one of the discharging circuit voltages is abnormal and all of the cell voltages are normal during the second diagnostic operation.

12. The abnormality diagnostic method as recited in claim 10, wherein the determining of whether the break exists in the electrical connection or the abnormality exists in one of the switches includes determining that the break exists in the electrical connection when one of the discharging circuit voltages is abnormal during the first diagnostic operation and when all of the discharging circuit voltages are normal and all of the cell voltages are normal during the second diagnostic operation.

13. The abnormality diagnostic method as recited in claim 10, further comprising performing a third diagnostic operation to turn on the switches corresponding to the even numbered ones of the cells.

14. The abnormality diagnostic method as recited in claim 13, wherein the determining of whether the break exists in the electrical connection or the abnormality exists in one of the switches includes determining that the abnormality exists in one of the switches when all of the discharging circuit voltages are normal during the first diagnostic operation and when one of the discharging circuit voltages is abnormal during the third diagnostic operation, and to determine that no abnormality in the switches and no break in the electrical connection exist when all of the discharging circuit voltages are normal during the first and third diagnostic operations.

15. The abnormality diagnostic method as recited in claim 9, wherein the detecting of the discharging circuit voltages includes detecting voltages across each of the switches, and the performing of the first diagnostic operation includes turning on the switches corresponding to the even numbered ones of the cells counted from a highest ordered one of the cells.

16. The abnormality diagnostic method as recited in claim 15, wherein the determining of whether the break exists in the electrical connection or the abnormality exists in one of the switches includes determining that the abnormality in one of the switches exists when one of the discharging circuit voltages is abnormal during the first diagnostic operation and when one of the discharging circuit voltages is abnormal during the second diagnostic operation, and determining the break in the electrical connection exists when one of the discharging circuit voltages is abnormal during the first diagnostic operation and when all of the discharging circuit voltages are normal and one of the cell voltages is abnormal during the second diagnostic operation.

17. The abnormality diagnostic method as recited in claim 15, further comprising performing a third diagnostic operation to turn off all of the switches.

18. The abnormality diagnostic method as recited in claim 17, wherein the determining of whether the break exists in the electrical connection or the abnormality exists in one of the switches includes determining that the abnormality exists in one of the switches when one of the discharging circuit voltages is abnormal during the first diagnostic operation, when all of the discharging circuit voltages are normal and all of the cell voltages are normal during the second diagnostic operation, and when all of the cell voltages are normal during the third diagnostic operation, and to determine that the break exists in the electrical connection when one of the discharging circuit voltages is abnormal during the first diagnostic operation, when all of the discharging circuit voltages are normal and all of the cell voltages are normal during the second diagnostic operation, and when one of the cell voltages is abnormal during the third diagnostic operation.

19. The abnormality diagnostic method as recited in claim 15, wherein the determining of whether the break exists in the electrical connection or the abnormality exists in one of the switches includes determining that the abnormality exists in one of the switches when all of the discharging circuit voltages are normal during the first diagnostic operation and when one of the discharging circuit voltages is abnormal during the second diagnostic operation.

20. The abnormality diagnostic method as recited in claim 17, wherein the determining of whether the break exists in the electrical connection or the abnormality exists in one of the switches includes determining that the abnormality exists in one of the switches when all of the discharging circuit voltages are normal during the first diagnostic operation, when all of the discharging circuit voltages are normal during the second diagnostic operation, and when one of the discharging circuit voltages is abnormal during the third diagnostic operation, and to determine no abnormality in the switches and no break in the electrical connection exist when all of the discharging circuit voltages and all of the cell voltages are normal during the first, second and third diagnostic operations.

* * * * *